US012689335B2

(12) United States Patent
Radwan

(10) Patent No.: US 12,689,335 B2
(45) Date of Patent: Jul. 21, 2026

(54) PROGRAMMABLE POWER AMPLIFIER

(71) Applicant: Apple Inc., Cupertino, CA (US)

(72) Inventor: Ahmed G Radwan, Munich (DE)

(73) Assignee: Apple Inc., Cupertino, CA (US)

( * ) Notice: Subject to any disclaimer, the term of this patent is extended or adjusted under 35 U.S.C. 154(b) by 369 days.

(21) Appl. No.: 18/218,421

(22) Filed: Jul. 5, 2023

(65) Prior Publication Data

US 2025/0015766 A1      Jan. 9, 2025

(51) Int. Cl.
| | |
|---|---|
| *H03F 3/191* | (2006.01) |
| *H03F 1/56* | (2006.01) |
| *H03F 3/24* | (2006.01) |
| *H04B 1/04* | (2006.01) |

(52) U.S. Cl.
CPC ............. *H03F 1/565* (2013.01); *H03F 3/245* (2013.01); *H04B 1/0458* (2013.01); *H03F 2200/387* (2013.01); *H04B 2001/0408* (2013.01)

(58) Field of Classification Search
CPC ........................................................ H03F 3/191
USPC ................................................. 330/302, 305
See application file for complete search history.

(56) References Cited

U.S. PATENT DOCUMENTS

| | | |
|---|---|---|
| 8,380,153 B2 | 2/2013 | Roufoogaran et al. |
| 9,270,248 B2 | 2/2016 | Bakalski et al. |
| 9,712,195 B2 | 7/2017 | Wang et al. |
| 10,284,166 B2 | 5/2019 | Sira |
| 10,574,286 B2 * | 2/2020 | Wang ...................... H03F 3/193 |
| 10,984,985 B2 | 4/2021 | Mavretic |
| 2022/0021365 A1 | 1/2022 | Vigilante et al. |
| 2022/0085840 A1 | 3/2022 | Mohammadnezhad et al. |
| 2023/0074812 A1 | 3/2023 | Almalkawi et al. |

* cited by examiner

*Primary Examiner* — Henry Choe
(74) *Attorney, Agent, or Firm* — FLETCHER YODER PC

(57) ABSTRACT

This disclosure is directed to a programmable power amplifier including an output impedance matching circuit, and a programmable inductance matching circuit. The inductance matching circuit may be coupled to the impedance matching circuit. The inductance matching circuit may include one or more shunt inductors to reduce an adverse effect of one or more capacitors of the programmable power amplifier. The inductance matching circuit may improve an output power of the power amplifier, adjust a center frequency (e.g., resonant frequency) for providing output signals by the power amplifier, or both. As such, an electronic device may include one or more power amplifiers having the inductance matching circuit to amplify input signals with improved output power, improve a bandwidth for providing the output signals based on adjusting the center frequency, or both.

20 Claims, 6 Drawing Sheets

10, 52, 60, 90

PROGRAMMABLE POWER AMPLIFIER

BACKGROUND

The present disclosure relates generally to power amplifiers of an electronic device. In particular, the present disclosure relates to capacitive power amplifiers including an output matching circuit to generate output signals based on receiving input signals.

A power amplifier may include capacitors to control output power linearity across a desired range of frequency. In operation, the capacitors of the power amplifier may reduce the output power of the transceiver. Moreover, the output matching circuit may generate the output signals in a frequency bandwidth. In some cases, the output matching circuit may generate the output signals with reduced frequency bandwidth and/or output power.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a power amplifier is described that may include a first branch, an impedance matching circuit, and an inductance matching circuit. The first branch may include a first resistor, a first capacitor coupled to the first resistor, and a first shunt capacitor coupled to the first capacitor. The impedance matching circuit may include a primary coil coupled to the first capacitor and the first shunt capacitor and a secondary coil. The inductance matching circuit may include a first shunt inductor coupled to the first capacitor, the first shunt capacitor, and the primary coil.

In another embodiment, a transmitter is described that may include a first branch, a second branch, an impedance matching circuit, and an inductance matching circuit. The first branch and the second branch may generate analog signals based on receiving outgoing data. The impedance matching circuit may include a primary coil coupled to the first branch and the second branch and a secondary coil. The inductance matching circuit may include a first shunt inductor coupled to the first branch and the primary coil and a second shunt inductor coupled to the second branch and the primary coil.

In yet another embodiment, an electronic device is described that may include a processor, one or more antennas, a power amplifier coupled to the processor and the one or more antennas, and an impedance matching circuit, and an inductance matching circuit. The power amplifier may include a first branch, a second branch, and an impedance matching circuit. The impedance matching circuit may include a primary coil coupled to the first branch and the second branch and a secondary coil. The inductance matching circuit may include a first shunt inductor coupled to the first branch and the primary coil and a second shunt inductor coupled to the second branch and the primary coil.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

DETAILED DESCRIPTION OF SPECIFIC EMBODIMENTS

Figure 1:
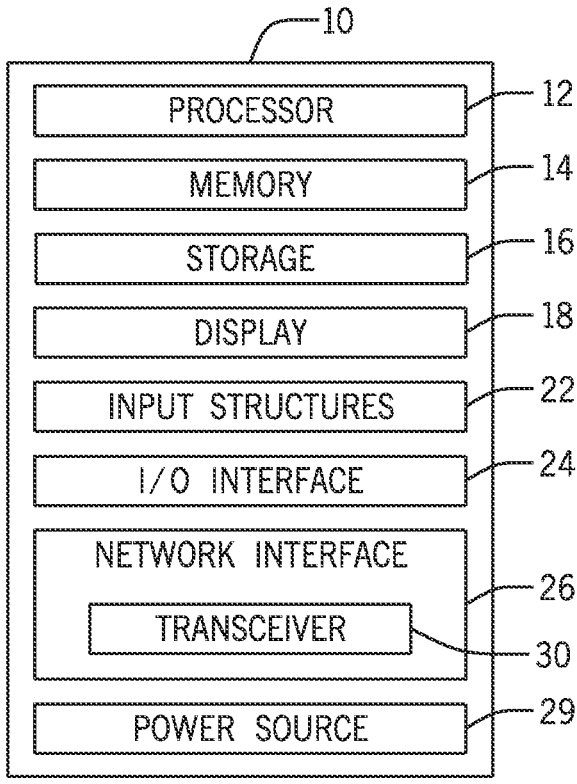
FIG. 1 is a block diagram of an electronic device, according to embodiments of the present disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the terms "approximately," "near," "about," "close to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on. Additionally, the term "set" may include one or more. That is, a set may include a unitary set of one member, but the set may also include a set of multiple members.

This disclosure is directed to a power amplifier including an output impedance matching circuit and an inductance matching circuit. The inductance matching circuit may be coupled to the impedance matching circuit. The inductance matching circuit may improve an output power of the power amplifier, adjust a center frequency (e.g., resonant frequency) for providing output signals by the power amplifier, or both. As such, an electronic device may include one or more power amplifiers having the inductance matching circuit to amplify input signals with improved output power, improve a bandwidth for providing the output signals based on adjusting the center frequency, or both.

The power amplifier may include a first branch and second branch each including respective series capacitors and shunt capacitors coupled to one or more drivers. The drivers may include any viable circuitry coupled to one or more input terminals of the power amplifier to provide the input signals. The impedance matching circuit may include a primary coil and a secondary coil. The inductance matching circuit may include one or more shunt inductors and one or more switches. The shunt inductors may couple to and uncouple from the first branch and the second branch and the impedance matching circuit by closing and opening the switches respectively. For example, a processor and/or a controller of an electronic device may provide control signals to close and open the switches.

The shunt inductors may couple to the series capacitors and the shunt capacitors of the first branch and the second branch when the switches are closed. Moreover, an inductive reactance of the shunt inductors may reduce (e.g., at least partly resonates out) a capacitive reactance of the shunt capacitors to reduce a reactive power consumption of the shunt capacitors. As such, coupling the shunt inductors to the shunt capacitors may improve a power factor for generating the output signals based on reducing a reactive power consumption of the shunt capacitors. Accordingly, the inductance matching circuit may increase the output power of the power amplifier by reducing the reactive power consumption of the series capacitors and/or the shunt capacitors of the first branch and the second branch. Furthermore, reducing the reactive power consumption of the series capacitors and/or the shunt capacitors of the first branch and the second branch may increase linearity of the power amplifier for generating the output signals across the bandwidth of the power amplifier for providing the output signals.

The shunt inductors may also couple to the primary coil of the impedance matching circuit when the switches are closed. For example, the shunt inductors and the primary coil may be disposed in parallel when the switches are closed. As such, the shunt inductors may reduce an inductance value of the primary coil to reduce an equivalent inductance of a primary side of the impedance matching circuit. Moreover, reducing the inductance of the primary side of the impedance matching circuit may increase (e.g., shift upward) the center frequency of the impedance matching circuit for generating the output signals. Accordingly, the inductance matching circuit may adjust the center frequency of the impedance matching circuit for outputting the output signals based on a frequency for transmission of the output signals.

In some cases, the inductive matching circuit may adjust the center frequency to shift a high threshold (e.g., a highest frequency) and/or a low threshold (e.g., a lowest frequency) of the bandwidth of the power amplifier. For example, the inductive matching circuit may shift the center frequency up to shift a high threshold of the bandwidth of the power amplifier for generating output signals with higher frequency and may shift the center frequency down to shift a low threshold of the bandwidth of the power amplifier for generating output signals with lower frequency. In such cases, the inductance matching circuit may increase the bandwidth of the power amplifier by adjusting the center frequency of the impedance matching circuit. As such, in some embodiments, the bandwidth of each power amplifier may correspond to a larger portion of the bandwidth of the electronic device. Accordingly, an electronic device may include a reduced number of power amplifiers for generating the output signals across a bandwidth of the electronic device (and/or a transmitter of the electronic device). In such embodiments, the electronic device may use a reduced circuit area for generating the output signals across the bandwidth of the electronic device. For example, a power amplifier (PA) of a transmitter of the electronic device may use a reduced circuit area based on including the power amplifier having the inductance matching circuit.

FIG. 1 is a block diagram of an electronic device 10, according to embodiments of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 22, an input/output (I/O) interface 24, a network interface 26, and a power source 29. The various functional blocks shown in FIG. 1 may include hardware elements (including circuitry), software elements (including machine-executable instructions) or a combination of both hardware and software elements (which may be referred to as logic). The processor 12, memory 14, the nonvolatile storage 16, the display 18, the input structures 22, the input/output (I/O) interface 24, the network interface 26, and/or the power source 29 may each be communicatively coupled directly or indirectly (e.g., through or via another component, a communication bus, a network) to one another to transmit and/or receive signals between one another. It should be noted that FIG. 1 is merely one example of a particular implementation and is intended to illustrate the types of components that may be present in the electronic device 10.

By way of example, the electronic device 10 may include any suitable computing device, including a desktop or notebook computer, a portable electronic or handheld electronic device such as a wireless electronic device or smartphone, a tablet, a wearable electronic device, and other similar devices. In additional or alternative embodiments, the electronic device 10 may include an access point, such as a base station, a router (e.g., a wireless or Wi-Fi router), a hub, a switch, and so on. It should be noted that the processor 12 and other related items in FIG. 1 may be embodied wholly or in part as software, hardware, or both. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may include one or more application processors, one or more baseband processors, or both, and perform the various functions described herein.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. In some embodiments, the I/O interface 24 may include an I/O port for a hardwired connection for charging and/or content manipulation using a standard connector and protocol, such as the Lightning connector, a universal serial bus (USB), or other similar connector and protocol. The network interface 26 may include, for example, one or more interfaces for a personal area network (PAN), such as an ultra-wideband (UWB) or a BLUETOOTH® network, a local area network (LAN) or wireless local area network (WLAN), such as a network employing one of the IEEE 802.11x family of protocols (e.g., WI-FI®), and/or a wide area network (WAN), such as any standards related to the Third Generation Partnership Project (3GPP), including, for example, a 3$^{rd}$ generation (3G) cellular network, universal mobile telecommunication system (UMTS), 4th generation (4G) cellular network, Long Term Evolution® (LTE) cellular network, Long Term Evolution License Assisted Access (LTE-LAA) cellular network, 5th generation (5G) cellular network, and/or New Radio (NR) cellular network, a 6th generation (6G) or greater than 6G cellular network, a satellite network, a non-terrestrial network, and so on. In particular, the network interface 26 may include, for example, one or more interfaces for using a cellular communication standard of the 5G specifications that include the millimeter wave (mmWave) frequency range (e.g., 24.25-300 gigahertz (GHz)) that defines and/or enables frequency ranges used for wireless communication. The network interface 26 of the electronic device 10 may allow communication over the aforementioned networks (e.g., 5G, Wi-Fi, LTE-LAA, and so forth).

The network interface 26 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 26 may include a transceiver 30. In some embodiments, all or portions of the transceiver 30 may be disposed within the processor 12. The transceiver 30 may support transmission and receipt of various wireless signals via one or more antennas, and thus may include a transmitter and a receiver. The power source 29 of the electronic device 10 may include any suitable source of power, such as a rechargeable lithium polymer (Li-poly) battery and/or an alternating current (AC) power converter.

Figure 2:
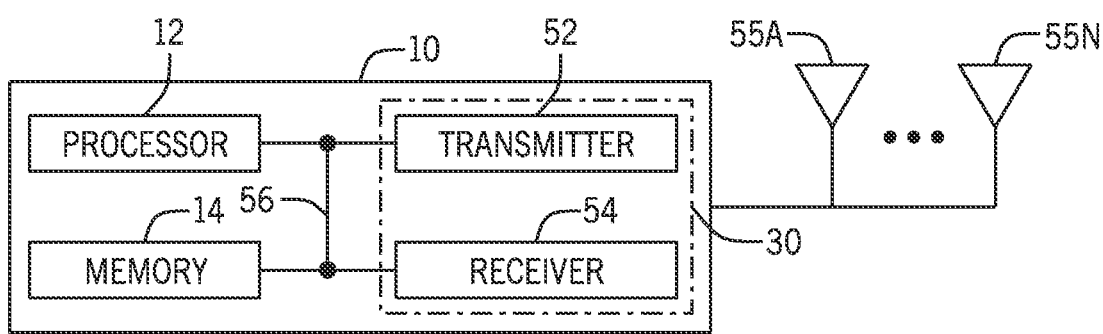
FIG. 2 is a functional diagram of the electronic device of FIG. 1, according to embodiments of the present disclosure.

FIG. 2 is a functional diagram of the electronic device 10 of FIG. 1, according to embodiments of the present disclosure. As illustrated, the processor 12, the memory 14, the transceiver 30, a transmitter 52, a receiver 54, and/or antennas 55 (illustrated as 55A-55N, collectively referred to as an antenna 55 or antennas 55) may be communicatively coupled directly or indirectly (e.g., through or via another component, a communication bus, a network) to one another to transmit and/or receive signals between one another.

The electronic device 10 may include the transmitter 52 and/or the receiver 54 that respectively enable transmission and reception of signals between the electronic device 10 and an external device via, for example, a network (e.g., including base stations or access points) or a direct connection. As illustrated, the transmitter 52 and the receiver 54 may be combined into the transceiver 30. The electronic device 10 may also have antennas 55A-55N electrically coupled to the transceiver 30. The antennas 55A-55N may be configured in an omnidirectional or directional configuration, in a single-beam, dual-beam, or multi-beam arrangement, and so on. Each antenna 55 may be associated with one or more beams and various configurations. In some embodiments, multiple antennas of the antennas 55A-55N of an antenna group or module may be communicatively coupled to a respective transceiver 30 and each emit radio frequency signals that may constructively and/or destructively combine to form a beam. The electronic device 10 may include multiple transmitters, multiple receivers, multiple transceivers, and/or multiple antennas as suitable for various communication standards. In some embodiments, the transmitter 52 and the receiver 54 may transmit and receive information via other wired or wireline systems or means.

As illustrated, the various components of the electronic device 10 may be coupled together by a bus system 56. The bus system 56 may include a data bus, for example, as well as a power bus, a control signal bus, and a status signal bus, in addition to the data bus. The components of the electronic device 10 may be coupled together or accept or provide inputs to each other using some other mechanism.

Figure 3:
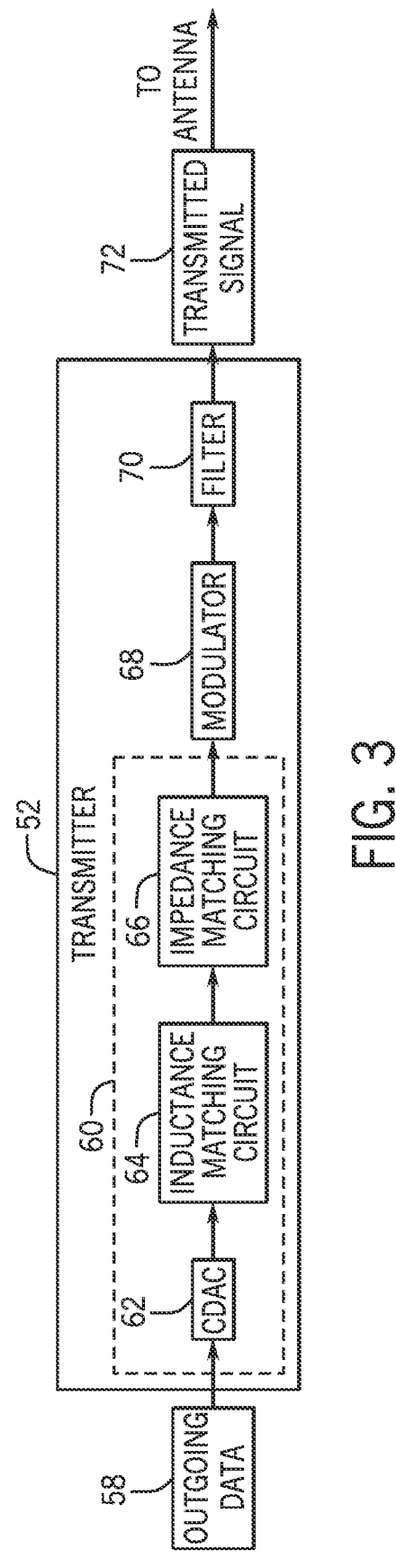
FIG. 3 is a schematic diagram of a transmitter of the electronic device of FIG. 1, according to embodiments of the present disclosure.

FIG. 3 is a schematic diagram of the transmitter 52 (e.g., transmit circuitry), according to embodiments of the present disclosure. As illustrated, the transmitter 52 may receive outgoing data 58 in the form of a digital signal to be transmitted via the antennas 55. A power amplifier (PA) 60 of the transmitter 52 may include a capacitive digital-to-analog converter (CDAC) 62, an inductance matching circuit 64, and an impedance matching circuit 66. It should be appreciated that in alternative or additional embodiments, the power amplifier 60 may omit the CDAC 62, include a different digital-to-analog converter (DAC) in lieu of the CDAC 62, among other possibilities.

In any case, in the depicted embodiment, the CDAC 62 may generate analog signals based on receiving the outgoing data 58 (e.g., may convert the digital signal to an analog signal). The inductance matching circuit 64 may cause the analog signals to match an input inductance of a subsequent circuit, and the impedance matching circuit 66 may provide the analog signals by matching (nearly matching) an input impedance of a subsequent circuit. The power amplifier 60 may amplify the analog signal to a suitable level to drive transmission of the signal via the antennas 55. In some embodiments, the inductance matching circuit 64 may adjust a center frequency and/or bandwidth of the power amplifier 60 for generating the analog signals. In some cases, the inductance matching circuit 64 may increase or facilitate increasing output power of the power amplifier 60 for generating the analog signals.

A modulator 68 may combine the converted analog signal with a carrier signal to generate a radio wave. A filter 70 (e.g., filter circuitry and/or software) of the transmitter 52 may then remove undesirable noise from the amplified signal (and/or amplified and modulated signal) to generate transmitted signal 72 to be transmitted via the antennas 55. The filter 70 may include any suitable filter or filters to remove the undesirable noise from the amplified signal, such as a bandpass filter, a bandstop filter, a low pass filter, a high pass filter, and/or a decimation filter.

The power amplifier 60, the modulator 68, and/or the filter 70 may be referred to as part of a radio frequency front end (RFFE), and more specifically, a transmit front end (TXFE) of the electronic device 10. Additionally, the transmitter 52 may include any suitable additional components not shown, or may not include certain of the illustrated components, such that the transmitter 52 may transmit the outgoing data 58 via the antennas 55. For example, the transmitter 52 may include a mixer and/or a digital up converter. As another example, the transmitter 52 may not include the filter 70 if the power amplifier 60 outputs the amplified signal in or approximately in a desired frequency range (such that filtering of the amplified signal may be unnecessary).

It should be appreciated that in some embodiments, the electronic device 10 may include multiple power amplifiers 60, multiple modulators 68, and/or multiple filters 70. In such embodiments, each of the power amplifiers 60, the modulators 68, and/or the filters 70 may couple to one or more antennas 55 of the antennas 55. In some embodiments, the electronic device 10 may include a reduced number of the power amplifiers 60, the modulators 68, and/or the filters 70 for generating the transmitted signal 72 across a bandwidth of the transmitter 52. Each of the inductance matching circuits 64 may enable the power amplifiers 60 to operate over an increased bandwidth based on adjusting the center frequency of the impedance matching circuit 66. As such, a reduced number of power amplifiers 60 may be used in the transmitter 52, thus reducing circuit area in the electronic device 10.

Figure 4:
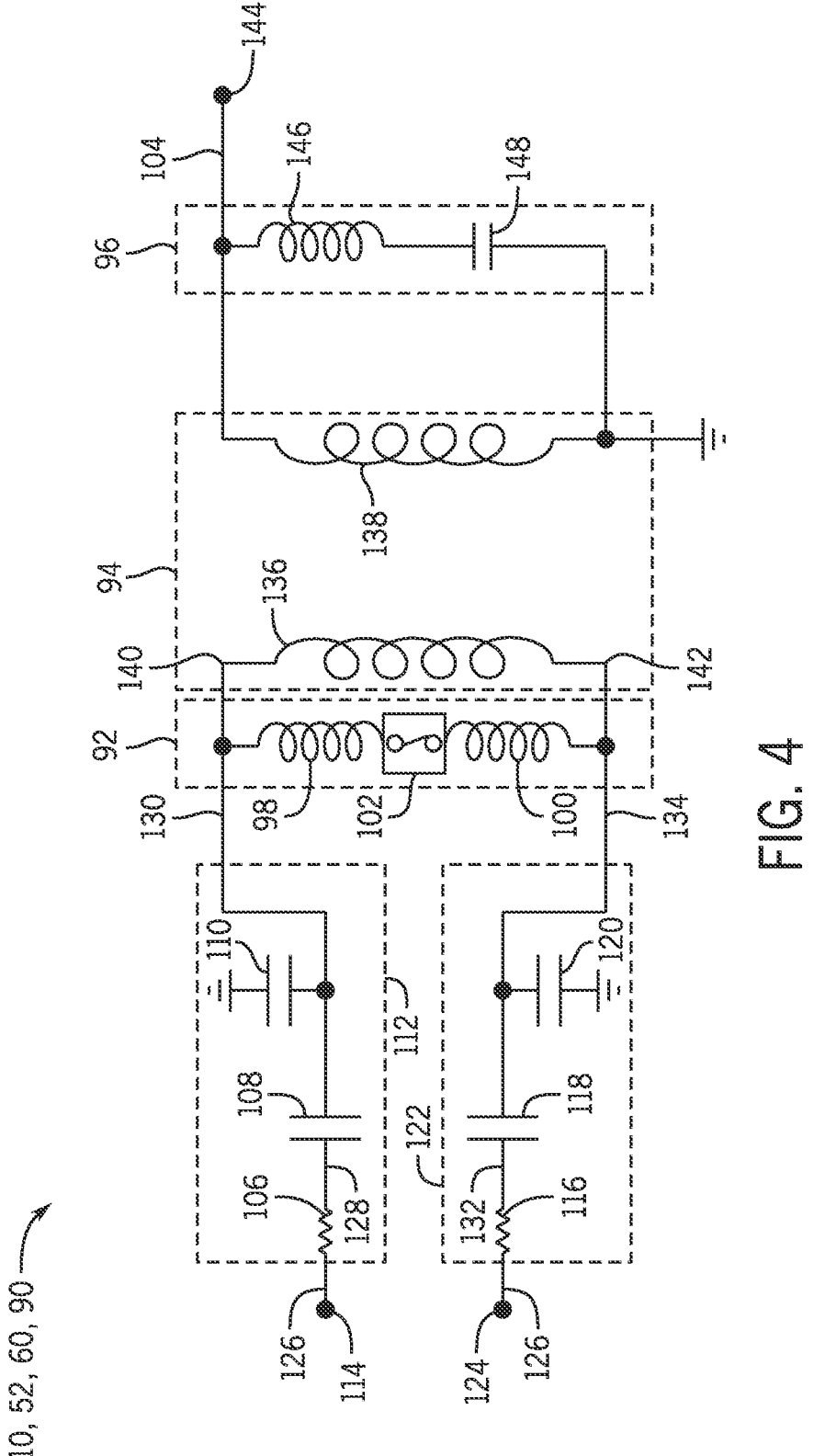
FIG. 4 is a circuit diagram of a first power amplifier of the transmitter of FIG. 3 including a first programmable inductance matching circuit including a first shunt inductor, a second shunt inductor, and a first middle switch coupled to the first shunt inductor and the second shunt inductor, and an impedance matching circuit, according to embodiments of the present disclosure.

FIG. 4 is a circuit diagram of a first power amplifier 90 including a first inductance matching circuit 92 (e.g., a first programmable inductance matching circuit), the impedance matching circuit 94, and a filter 96. The first inductance matching circuit 92 may include a first shunt inductor 98, a second shunt inductor 100, and a first middle switch 102. The first middle switch 102 may be coupled to the first shunt inductor 98 and the second shunt inductor 100. The first inductance matching circuit 92 may improve output power and a bandwidth of the first power amplifier 90 for generating amplified signals 104 (e.g., output signals), as will be appreciated. In some embodiments, the power amplifier 60 of the electronic device 10 discussed above with respect to FIG. 3 may include the first power amplifier 90. In such embodiments, the power amplifier 60 may generate the amplified signals 104 with improved output power and/or the bandwidth. For example, the bandwidth of each first power amplifier 90 may correspond to a larger portion of the bandwidth of the electronic device 10. As such, in some cases, the electronic device 10 may include a reduced number of power amplifiers 60 and/or transmitters 52 to generate the amplified signals 104 based on including the first power amplifier 90. In such cases, a circuit area of the transmitter 52 and/or the electronic device 10 may be reduced.

In any case, a first branch 112 of the first power amplifier 90 may include a first resistor 106, a first capacitor 108, and a first shunt capacitor 110. The first resistor 106 may be coupled to a first input terminal 114 of the first power amplifier 90. Moreover, a second branch 122 of the first power amplifier 90 may include a second resistor 116, a second capacitor 118, and a second shunt capacitor 120. The second resistor 116 may be coupled to a second input terminal 124 of the first power amplifier 90. The first input terminal 114 and the second input terminal 124 may couple to external circuitry (e.g., differential drivers) to receive input signals 126. For example, the first input terminal 114 and the second input terminal 124 may receive the outgoing data 58 discussed above with respect to FIG. 3. In different embodiments, the external circuitry may include the processor 12 of the electronic device 10 discussed above with respect to FIG. 1, or any other viable circuit.

The first capacitor 108 may couple to the first resistor 106 at a first node 128 and may couple to the first shunt capacitor 110 at a second node 130. Moreover, the second capacitor 118 may couple to the second resistor 116 at a third node 132 and may couple to the second shunt capacitor 120 at a fourth node 134. In the depicted embodiment, the first shunt capacitor 110 and the second shunt capacitor 120 are coupled to a ground connection. It should be appreciated that in alternative or additional embodiments, the first shunt capacitor 110 and the second shunt capacitor 120 may be virtually grounded. For example, the first shunt capacitor 110 may be coupled to the second shunt capacitor 120 to induce a virtual ground between the first shunt capacitor 110 and the second shunt capacitor 120.

As mentioned above, the first middle switch 102 of the first inductance matching circuit 92 may be coupled to the first shunt inductor 98 and the second shunt inductor 100. In some embodiments, the first branch 112 and the second branch 122 of the first power amplifier 90 may receive differential input signals 126. In such embodiments, the first middle switch 102 may close to induce a virtual ground between the first shunt inductor 98 and the second shunt inductor 100. Moreover, the impedance matching circuit 94 may include a primary coil 136 and a secondary coil 138 that may inductively couple based on a coupling coefficient. The primary coil 136 may have a first terminal 140 and a second terminal 142.

With the foregoing in mind, the first shunt inductor 98 may couple to the first capacitor 108, the first shunt capacitor 110, and the first terminal 140 of the primary coil 136 at the second node 130 when the first middle switch 102 is closed. An inductive reactance of the first shunt inductor 98 may reduce (e.g., at least partly resonates out) a capacitive reactance of the first shunt capacitor 110 during operation. As such, coupling the first shunt inductor 98 to the first shunt capacitor 110 may improve a power factor of the first power amplifier 90 for generating the amplified signals 104 based on reducing a reactive power consumption of the first shunt capacitor 110.

The first shunt inductor 98 may increase the output power of the first power amplifier 90 by reducing a reactive power consumption of the first shunt capacitor 110. Accordingly, the first inductance matching circuit 92 may increase the output power of the first power amplifier 90 by reducing the reactive power consumption of the first power amplifier 90. Moreover, reducing the reactive power consumption of the first power amplifier 90 may increase linearity of the first power amplifier 90 for generating the amplified signals 104 across the bandwidth of the first power amplifier 90.

The first shunt inductor 98 and the primary coil 136 may be disposed in parallel when the first middle switch 102 is closed. As such, the first shunt inductor 98 may reduce an inductance value of the primary coil 136 to reduce an equivalent inductance of a primary side of the impedance matching circuit 94. In some cases, reducing the inductance of the primary side of the impedance matching circuit 94 may increase (e.g., shift higher) the center frequency of the impedance matching circuit 94 for generating the amplified signals 104. The secondary coil 138 may output the amplified signals 104 via the output terminal 144.

The second shunt inductor 100 may couple to the second capacitor 118, the second shunt capacitor 120, and the second terminal 142 of the primary coil 136 at the fourth node 134 when the first middle switch 102 is closed. An inductive reactance of the second shunt inductor 100 may reduce (e.g., at least partly resonates out) a capacitive reactance of the second shunt capacitor 120 during operation. As such, coupling the second shunt inductor 100 to the second shunt capacitor 120 may improve the power factor of the first power amplifier 90 for generating the amplified signals 104 based on reducing a reactive power consumption of the second shunt capacitor 120.

The second shunt inductor 100 may increase the output power of the first power amplifier 90 by reducing a reactive power consumption of the second shunt capacitor 120. Accordingly, the first inductance matching circuit 92 may increase the output power of the first power amplifier 90 by reducing the reactive power consumption of the first power amplifier 90. Moreover, as mentioned above, reducing the reactive power consumption of the first power amplifier 90 may increase linearity of the first power amplifier 90 for generating the amplified signals 104 across the bandwidth of the first power amplifier 90.

The second shunt inductor 100 and the primary coil 136 may be disposed in parallel when the second shunt inductor 100 is closed. As such, the second shunt inductor 100 may reduce an inductance value of the primary coil 136 to reduce an equivalent inductance of a primary side of the impedance matching circuit 94. As mentioned above, reducing the inductance of the primary side of the impedance matching circuit 94 may increase (e.g., shift higher) the center frequency of the impedance matching circuit 94. Accordingly, the first inductance matching circuit 92 may adjust the center frequency of the impedance matching circuit 94 for outputting the output signals.

In some embodiments, the filter 96 (e.g., a notch filter, the filter 70, among other possibilities) may include an output inductor 146 and an output capacitor 148 to filter the amplified signals 104. For example, the filter 96 may reduce undesired portions of the amplified signals 104 having a frequency higher than a threshold, below a threshold, outside a high threshold and a low threshold, or inside a high threshold and a low threshold.

In some embodiments, the first inductance matching circuit 92 may adjust the center frequency to shift a high threshold (e.g., a highest frequency) and/or a low threshold (e.g., a lowest frequency) of the bandwidth of the first power amplifier 90. In such embodiments, the first inductance matching circuit 92 may increase the bandwidth of the first power amplifier 90 by adjusting the center frequency of the impedance matching circuit 94. In some cases, the bandwidth of each first power amplifier 90 may correspond to a larger portion of the bandwidth of the electronic device 10. Accordingly, the electronic device 10 may include a reduced number of the first power amplifiers 90 for generating the amplified signals 104 across the bandwidth of the transmitter 52. In such embodiments, the electronic device 10 may use a reduced circuit area for generating the output signals across the bandwidth of the transmitter 52.

The first shunt inductor 98 may disconnect or uncouple from the first branch 112 and the second shunt inductor 100 may disconnect or uncouple from the second branch 122 of the first power amplifier 90 when the first middle switch 102 is open. In some embodiments, the processor 12 of the electronic device 10 discussed above with respect to FIG. 1, or any other viable processor and/or controller may generate control signals to close and open the first middle switch 102. The center frequency of the impedance matching circuit 94 for generating the amplified signals 104 may decrease (e.g., shift lower) when the first middle switch 102 is open.

It should be appreciated that in alternative or additional embodiments, the first power amplifier 90 may include additional and/or reduced components. For example, it should be appreciated that although the illustrated first power amplifier 90 includes differential input terminals 114 and 124, in alternative or additional embodiments, the first power amplifier 90 may have a single-ended input receiving the input signals 126. In such embodiments, the single-ended first power amplifier 90 may include the first resistor 106, the first capacitor 108, the first shunt capacitor 110, and the first shunt inductor 98 coupled to the first terminal of the primary coil 136. For example, the first shunt inductor 98 may couple to and uncouple from a ground connection via the first middle switch 102. The second terminal of the primary coil 136 and the secondary coil 138 may also be coupled to the ground connection.

Figure 5:
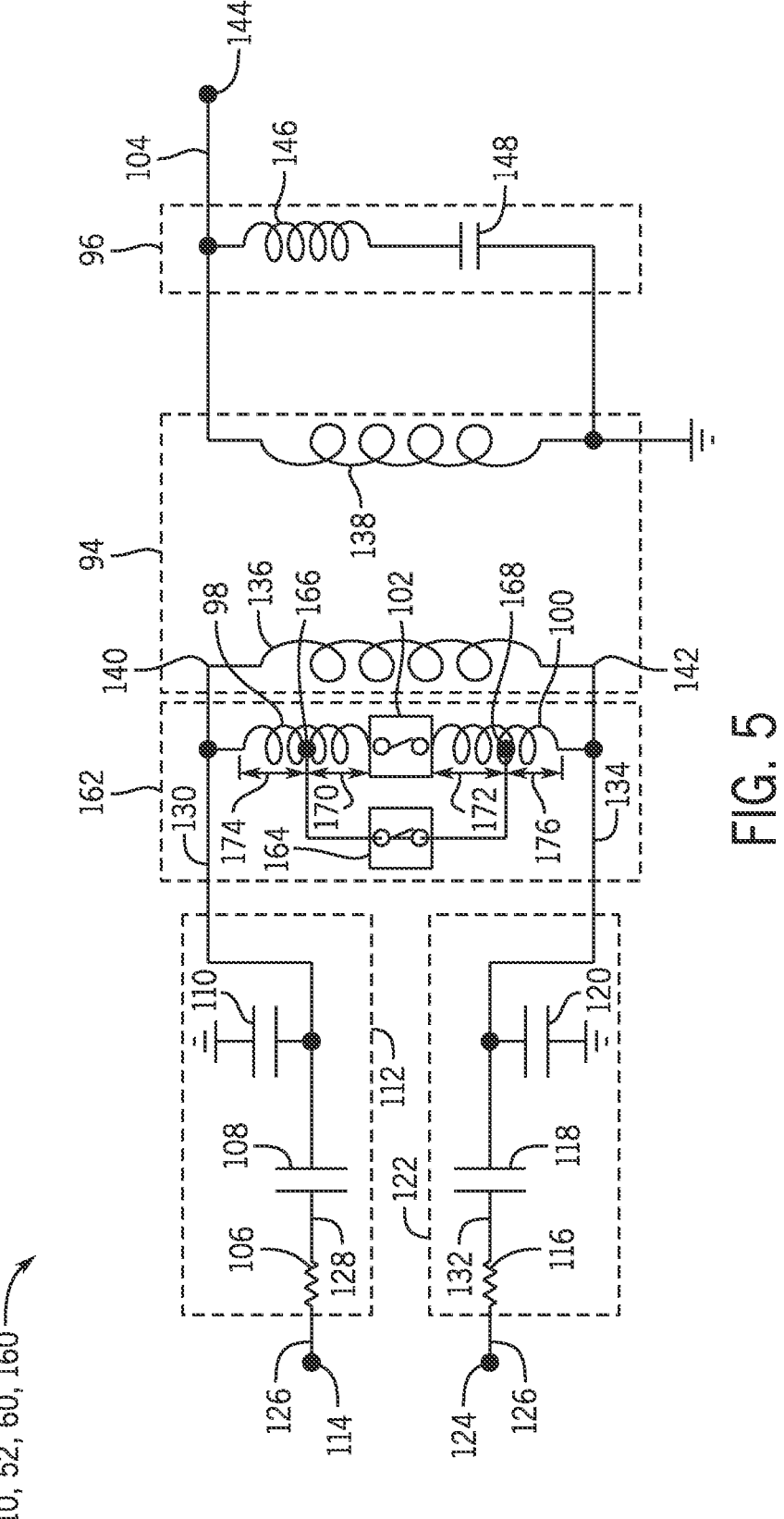
FIG. 5 is a circuit diagram of a second power amplifier of the transmitter of FIG. 3 including a second programmable inductance matching circuit including the first shunt inductor, the second shunt inductor, the first middle switch, and a second middle switch coupled to intermediate tapping points of the first shunt inductor and the second shunt inductor, and the impedance matching circuit, according to embodiments of the present disclosure.

FIG. 5 is a schematic diagram of a second power amplifier 160 including a second inductance matching circuit 162 (e.g., a second programmable inductance matching circuit), the impedance matching circuit 94, and the filter 96. The second inductance matching circuit 162 may improve output power and a bandwidth of the second power amplifier 160 for generating the amplified signals 104 (e.g., output signals), as will be appreciated. In some embodiments, the power amplifier 60 of the electronic device 10 discussed above with respect to FIG. 3 may include the second power amplifier 160. In such embodiments, the power amplifier 60 may generate the amplified signals 104 with improved output power and/or the bandwidth. For example, the bandwidth of each second power amplifier 160 may correspond to a larger portion of the bandwidth of the electronic device 10. Accordingly, the electronic device 10 may include a reduced number of power amplifiers 60 and/or transmitters 52 to generate the amplified signals 104 based on including the second power amplifier 160. In such cases, a circuit area of the transmitter 52 and/or the electronic device 10 may be reduced.

The second power amplifier 160 may include the first branch 112 including the first resistor 106, the first capacitor 108, and the first shunt capacitor 110. The first resistor 106 may be coupled to the first input terminal 114 to receive the input signals 126. The first capacitor 108 may be coupled to the first resistor at the first node 128. The first shunt capacitor 110 may be coupled to the first capacitor 108 at the second node 130. Moreover, the second power amplifier 160 may include the second branch 122 including the second resistor 116, the second capacitor 118, and the second shunt capacitor 120. The second resistor 116 may be coupled to the second input terminal 124 to receive the input signals 126 (e.g., the differential input signals). The second capacitor may be coupled to the second resistor at the third node 132. The second shunt capacitor 120 may be coupled to the second capacitor 118 at the fourth node 134.

The second inductance matching circuit 162 may include the first shunt inductor 98, the second shunt inductor 100, the first middle switch 102, and a second middle switch 164. The first middle switch 102 may be coupled to the first shunt inductor 98 and the second shunt inductor 100. The second middle switch 164 may be coupled to a first intermediate tapping point 166 of the first shunt inductor 98 (e.g., by splitting a coil of the first shunt inductor 98 into two equal or unequal parts at the first intermediate tapping point 166, bisecting the first shunt inductor 98) at the first intermediate tapping point 166 and a second intermediate tapping point 168 of the second shunt inductor 100 (e.g., by splitting a coil of the second shunt inductor 100 into two equal or unequal parts at the second intermediate tapping point 168, bisecting the second shunt inductor 100 at the second intermediate tapping point 168). In different embodiments, the second middle switch 164 may be coupled to different intermediate tapping points of the first shunt inductor 98 and/or the second shunt inductor 100. As such, a first fraction 170 (e.g., one eighth, three eights, a quarter, half, five ninth, and so on) of the first shunt inductor 98 and/or a second fraction 172 (e.g., one eighth, three eights, a quarter, half, five ninth, and so on) of the second shunt inductor 100 may be bypassed when the second middle switch 164 is closed (and the first middle switch 102 is open).

As mentioned above, the impedance matching circuit 94 may include the primary coil 136 and the secondary coil 138. The primary coil 136 may have the first terminal 140 and the second terminal 142. Moreover, the filter 96 (e.g., a notch filter, the filter 70, among other possibilities) may include an output inductor 146 and an output capacitor 148 to filter the amplified signals 104. For example, the filter 96 may reduce undesired portions of the amplified signals 104 having a frequency higher than a threshold, below a threshold, outside a high threshold and a low threshold, or inside a high threshold and a low threshold.

With the foregoing in mind, the first shunt inductor 98 may couple to the first capacitor 108, the first shunt capacitor 110, and the first terminal 140 of the primary coil 136 at the second node 130 when the first middle switch 102 is closed (and the second middle switch 164 is open). Moreover, a third fraction 174 of the first shunt inductor 98 may couple to the first capacitor 108, the first shunt capacitor 110, and the first terminal 140 of the primary coil 136 at the second node 130 when the second middle switch 164 is closed (and the first middle switch 102 is open). As mentioned above, the inductive reactance of the first shunt inductor 98 may reduce (e.g., at least partly resonates out) a capacitive reactance of the first shunt capacitor 110 during operation. As such, coupling the first shunt inductor 98 to the first shunt capacitor 110 may improve the power factor of the second power amplifier 160 for generating the amplified signals 104 based on reducing the reactive power consumption of the first shunt capacitor 110.

The first shunt inductor 98 may increase the output power of the second power amplifier 160 by a first output power amount and the third fraction 174 of the first shunt inductor 98 may increase the output power of the second power amplifier 160 by a second output power amount. For example, the first shunt inductor 98 may reduce a reactive power consumption of the first shunt capacitor 110 to a first reduced reactive power consumption and the third fraction 174 of the first shunt inductor 98 may reduce a reactive power consumption of the first shunt capacitor 110 to a second reduced reactive power consumption. In specific cases, the second reduced reactive power consumption may be higher than the first reduced reactive power consumption. That is, the second inductance matching circuit 162 may increase the output power of the second power amplifier 160 by reducing the reactive power consumption of the second power amplifier 160 to a first increased output power based on the first reduced reactive power consumption.

Moreover, the second inductance matching circuit 162 may increase the output power of the second power amplifier 160 by reducing the reactive power consumption of the second power amplifier 160 to a second increased output power based on the second reduced reactive power consumption. In some cases, closing the first middle switch 102 or closing the second middle switch 164 may increase the output power of the second power amplifier 160 to different (or similar) output power levels. Moreover, reducing the reactive power consumption of the second power amplifier 160 may increase linearity of the second power amplifier 160 for generating the amplified signals 104 across the bandwidth of the second power amplifier 160.

The second shunt inductor 100 may couple to the second capacitor 118, the second shunt capacitor 120, and the second terminal 142 of the primary coil 136 at the fourth node 134 when the first middle switch 102 is closed (and the second middle switch 164 is open). Moreover, a fourth fraction 176 of the second shunt inductor 100 may couple to the second capacitor 118, the first shunt capacitor 110, and the first terminal 140 of the primary coil 136 at the fourth node 134 when the second middle switch 164 is closed (and the first middle switch 102 is open). As mentioned above, the inductive reactance of the second shunt inductor 100 may reduce (e.g., at least partly resonates out) a capacitive reactance of the second shunt capacitor 120 during operation. As such, coupling the second shunt inductor 100 to the second shunt capacitor 120 may improve the power factor of the second power amplifier 160 for generating the amplified signals 104 based on reducing the reactive power consumption of the second shunt capacitor 120.

The second shunt inductor 100 may increase the output power of the second power amplifier 160 by a third output power amount and the fourth fraction 176 of the second shunt inductor 100 may increase the output power of the second power amplifier 160 by a fourth output power amount. For example, the second shunt inductor 100 may reduce the reactive power consumption of the second shunt capacitor 120 to a third reduced reactive power consumption and the fourth fraction 176 of the second shunt inductor 100 may reduce the reactive power consumption of the second shunt capacitor 120 to a fourth reduced reactive power consumption. In specific cases, the fourth reduced reactive power consumption may be higher than the third reduced reactive power consumption. That is, the second inductance matching circuit 162 may increase the output power of the second power amplifier 160 by reducing the reactive power consumption of the second power amplifier 160 to a third increased output power based on the third reduced reactive power consumption.

Moreover, the second inductance matching circuit 162 may increase the output power of the second power amplifier 160 by reducing the reactive power consumption of the second power amplifier 160 to a fourth increased output power based on the fourth reduced reactive power consumption. As mentioned above, in some cases, closing the first middle switch or closing the second middle switch may increase the output power of the second power amplifier 160 to different (or similar) output power levels. Moreover, reducing the reactive power consumption of the second power amplifier 160 may increase linearity of the second power amplifier 160 for generating the amplified signals 104 across the bandwidth of the second power amplifier 160.

The first shunt inductor 98 and the primary coil 136 may be disposed in parallel when the first middle switch 102 is closed (and the second middle switch is open). Similarly, the second shunt inductor 100 and the primary coil 136 may be disposed in parallel when the first middle switch 102 is closed (and the second middle switch is open). As such, the first shunt inductor 98 and the second shunt inductor 100 may reduce the inductance value of the primary coil 136 to reduce the equivalent inductance of the primary side of the impedance matching circuit 94 by a first inductance reduction value. In some cases, reducing the inductance of the primary side of the impedance matching circuit 94 by the first inductance reduction value may increase (e.g., shift higher) a center frequency of the impedance matching circuit 94 (and the second power amplifier 160) for generating the amplified signals 104 by a first frequency value. As such, the secondary coil 138 may output the amplified signals 104 via the output terminal 144 with a first increased frequency.

Moreover, the third fraction 174 of the first shunt inductor 98 may be disposed in parallel with the primary coil 136 when the second middle switch 164 is closed (and the first middle switch is open). Similarly, the fourth fraction 176 of the second shunt inductor 100 may be disposed in parallel with the primary coil 136 when the second middle switch 164 is closed (and the first middle switch is open). As such, the third fraction 174 of the first shunt inductor 98 and the fourth fraction of the second shunt inductor 100 may reduce the inductance value of the primary coil 136 to a lower inductance value to reduce the equivalent inductance of the primary side of the impedance matching circuit 94 by a second inductance reduction value.

In specific cases, the second inductance reduction value may be smaller than the first inductance reduction value. Moreover, in some cases, reducing the inductance of the primary side of the impedance matching circuit 94 by the second inductance reduction value may increase (e.g., shift higher) the center frequency of the impedance matching circuit 94 for generating the amplified signals 104 by a second frequency value. In some embodiments, the second frequency value may be higher than the first frequency value. As such, the secondary coil 138 may output the amplified signals 104 via the output terminal 144 with a second increased frequency. For example, the second increased frequency may be higher than the first increased frequency.

The first shunt inductor 98 may disconnect or uncouple from the first branch 112 and the second shunt inductor 100 may disconnect or uncouple from the second branch 122 of the first power amplifier 90 when the first middle switch 102 and the second middle switch 164 are open. In some embodiments, the processor 12 of the electronic device 10 discussed above with respect to FIG. 1, or any other viable processor and/or controller may generate control signals to close and open the first middle switch 102 and the second middle switch 164.

In some embodiments, the second inductance matching circuit 162 may adjust the center frequency to shift a high threshold and/or a low threshold of the bandwidth of the second power amplifier 160. For example, the processor 12 may generate control signals to close the first middle switch (when the second middle switch 164 is open) to shift the center frequency up by the first frequency value or may close the second middle switch 164 (when the first middle switch 102 is open) to shift the center frequency up by the second frequency value. In such embodiments, the second inductance matching circuit 162 may increase the bandwidth of the second power amplifier 160 by adjusting the center frequency of the impedance matching circuit 94. For example, the bandwidth of each second power amplifier 160 may correspond to a larger portion of the bandwidth of the electronic device 10. Accordingly, in some cases, the electronic device 10 may include a reduced number of the second power amplifiers 160 for generating the amplified signals 104 across the bandwidth of the transmitter 52. In such embodiments, the electronic device 10 may use a reduced circuit area for generating the output signals across the bandwidth of the transmitter 52.

It should be appreciated that in alternative or additional embodiments, the second power amplifier 160 may include additional and/or reduced components. For example, it should be appreciated that although the illustrated second power amplifier 160 includes differential input terminals 114 and 124, in alternative or additional embodiments, the second power amplifier 160 may have a single-ended input receiving the input signals 126. In such embodiments, the single-ended second power amplifier 160 may include the first resistor 106, the first capacitor 108, the first shunt capacitor 110, and the first shunt inductor 98 coupled to the first terminal of the primary coil 136. For example, the first shunt inductor 98 or the third fraction 174 of the first shunt inductor 98 may couple to and uncouple from a ground connection via the first middle switch 102 and the second middle switch respectively. The second terminal of the primary coil 136 and the secondary coil 138 may also be coupled to the ground connection.

Figure 6:
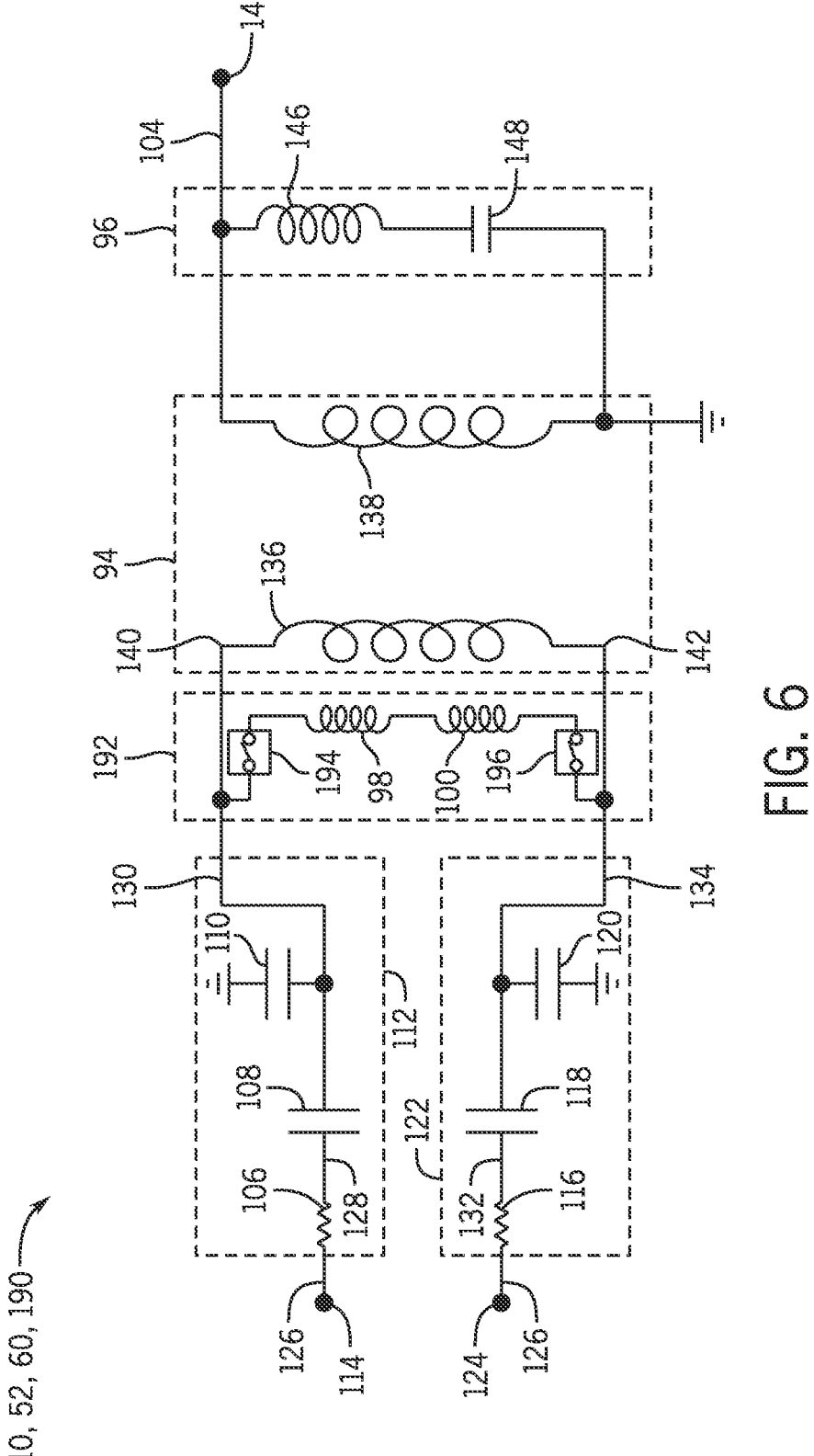
FIG. 6 is a circuit diagram of a third power amplifier of the transmitter of FIG. 3 including a third programmable inductance matching circuit including the first shunt inductor, the second shunt inductor, a first side switch, and a second side switch, and the impedance matching circuit, according to embodiments of the present disclosure.

FIG. 6 is a schematic diagram of a third power amplifier 190 including a third inductance matching circuit 192 (e.g., a third programmable inductance matching circuit), the impedance matching circuit 94, and the filter 96. The third inductance matching circuit 192 may improve output power and a bandwidth of the third power amplifier 190 for generating the amplified signals 104 (e.g., output signals), as will be appreciated. In some embodiments, the power amplifier 60 of the electronic device 10 discussed above with respect to FIG. 3 may include the third power amplifier 190.

In such embodiments, the power amplifier 60 may generate the amplified signals 104 with improved output power and/or bandwidth. For example, the bandwidth of each third power amplifier 190 may correspond to a larger portion of the bandwidth of the electronic device 10. Accordingly, the electronic device 10 may include a reduced number of power amplifiers 60 and/or transmitters 52 to generate the amplified signals 104 based on including the third power amplifier 190. In such cases, a circuit area of the transmitter 52 and/or the electronic device 10 may be reduced.

As discussed above, the third power amplifier 190 may include the first branch 112 including the first resistor 106, the first capacitor 108, and the first shunt capacitor 110. The first resistor 106 may be coupled to the first input terminal 114 to receive the input signals 126. The first capacitor 108 may be coupled to the first resistor at the first node 128. The first shunt capacitor 110 may be coupled to the first capacitor 108 at the second node 130. Moreover, the third power amplifier 190 may include the second branch 122 including the second resistor 116, the second capacitor 118, and the second shunt capacitor 120. The second resistor 116 may be coupled to the second input terminal 124 to receive the input signals 126 (e.g., the differential input signals). The second capacitor may be coupled to the second resistor at the third node 132. The second shunt capacitor 120 may be coupled to the second capacitor 118 at the fourth node 134.

As mentioned above, the impedance matching circuit 94 may include the primary coil 136 and the secondary coil 138. The primary coil 136 may have the first terminal 140 and the second terminal 142. Moreover, the filter 96 (e.g., a notch filter, the filter 70, among other possibilities) may include an output inductor 146 and an output capacitor 148 to filter the amplified signals 104. For example, the filter 96 may reduce undesired portions of the amplified signals 104 having a frequency higher than a threshold, below a threshold, outside a high threshold and a low threshold, or inside a high threshold and a low threshold.

The third inductance matching circuit 192 may include the first shunt inductor 98, the second shunt inductor 100, a first side switch 194, and a second side switch 196. The first side switch 194 may be coupled to the first shunt inductor 98 on one side and may be coupled to the first capacitor 108, the first shunt capacitor 110, and the first terminal 140 of the primary coil 136 at the second node 130 on a second side. The second side switch 196 may be coupled to the second shunt inductor 100 on one side and may be coupled to the second capacitor 118, the second shunt capacitor 120, and the second terminal 142 of the primary coil 136 at the fourth node 134 on a second side.

In some embodiments, the processor 12 of the electronic device 10 discussed above with respect to FIG. 1, or any other viable processor and/or controller may generate control signals to close and open the first side switch 194 and the second side switch 196. In some cases, the processor 12 may open and close the first side switch 194 with the second side switch 196. For example, the processor 12 may provide the control signals to the first side switch 194 with providing control signals to the second side switch 196. The first shunt inductor 98 may disconnect or uncouple from the first branch 112 and the second shunt inductor 100 may disconnect or uncouple from the second branch 122 of the first power amplifier 90 when the first side switch 194 and/or the second side switch 196 are open.

The first shunt inductor 98 may couple to the first capacitor 108, the first shunt capacitor 110, and the first terminal 140 of the primary coil 136 at the second node 130 when the first side switch 194 and the second side switch 196 are closed. The second shunt inductor 100 may couple to the second capacitor 118, the second shunt capacitor 120, and the second terminal 142 of the primary coil 136 at the fourth node 134 when the first side switch 194 and the second side switch 196 are closed. As mentioned above, the inductive reactance of the first shunt inductor 98 may reduce (e.g., at least partly resonates out) a capacitive reactance of the first shunt capacitor 110 during operation. Moreover, the inductive reactance of the second shunt inductor 100 may reduce (e.g., at least partly resonates out) a capacitive reactance of the second shunt capacitor 120 during operation. As such, coupling the first shunt inductor 98 to the first shunt capacitor 110 and coupling the second shunt inductor 100 to the second shunt capacitor 120 may improve the power factor of the third power amplifier 190 for generating the amplified signals 104 based on reducing the reactive power consumption of the first shunt capacitor 110 and the second shunt capacitor 120.

As discussed above, coupling the first shunt inductor 98 and the second shunt inductor 100 may increase the output power of the second power amplifier 160. For example, the first shunt inductor 98 may reduce the reactive power consumption of the first shunt capacitor 110 and the second shunt inductor 100 may reduce the reactive power consumption of the first shunt capacitor 110. Accordingly, the third inductance matching circuit 192 may increase the output power of the third power amplifier 190 by reducing the reactive power consumption of the third power amplifier 190.

The first shunt inductor 98 and the second shunt inductor 100 may couple to the primary coil 136 in parallel when the first side switch 194 and the second side switch are closed. As such, the first shunt inductor 98 and the second shunt inductor 100 may reduce the inductance of the primary coil 136 to reduce the equivalent inductance of the primary side of the impedance matching circuit 94. In some cases, reducing the inductance of the primary side of the impedance matching circuit 94 may increase (e.g., shift higher) a center frequency of the impedance matching circuit 94 (and the third power amplifier 190) for generating the amplified signals 104. As such, the secondary coil 138 may output the amplified signals 104 via the output terminal 144.

In some embodiments, the third inductance matching circuit 192 may adjust the center frequency to shift a high threshold and/or a low threshold of the bandwidth of the third power amplifier 190. For example, the processor 12 may generate the control signals to close the first side switch and the second side switch to shift the center frequency up by the first frequency value. In such embodiments, the third inductance matching circuit 192 may increase the bandwidth of the third power amplifier 190 by adjusting the center frequency of the impedance matching circuit 94. In some cases, the bandwidth of each third power amplifier 190 may correspond to a larger portion of the bandwidth of the electronic device 10. Accordingly, in some cases, the electronic device 10 may include a reduced number of the third power amplifiers 190 for generating the amplified signals 104 across the bandwidth of the transmitter 52. In such embodiments, the electronic device 10 may use a reduced circuit area for generating the output signals across the bandwidth of the transmitter 52.

It should be appreciated that in alternative or additional embodiments, the third power amplifier 190 may include additional and/or reduced components. For example, it should be appreciated that although the illustrated third power amplifier 190 includes differential input terminals 114 and 124, in alternative or additional embodiments, the third power amplifier 190 may have a single-ended input receiving the input signals 126. In such embodiments, the single-ended third power amplifier 190 may include the first resistor 106, the first capacitor 108, and the first shunt capacitor 110 coupled to the first terminal of the primary coil 136 at the second node. The single-ended third power amplifier 190 may also include the first shunt inductor 98. A first side of the first shunt inductor 98 may be coupled to the first resistor 106, the first capacitor 108, the first shunt capacitor 110, and the first terminal 140 of the primary coil 136 via the first side switch 194. A second side of the first shunt inductor 98 may be coupled to the ground connection. For example, the first shunt inductor 98 may couple to and uncouple from the first resistor 106, the first capacitor 108, the first shunt capacitor 110, and the first terminal 140 of the primary coil 136 based on closing and opening the first side switch 194 respectively. The second terminal of the primary coil 136 and the secondary coil 138 may also be coupled to the ground connection.

Figure 7:
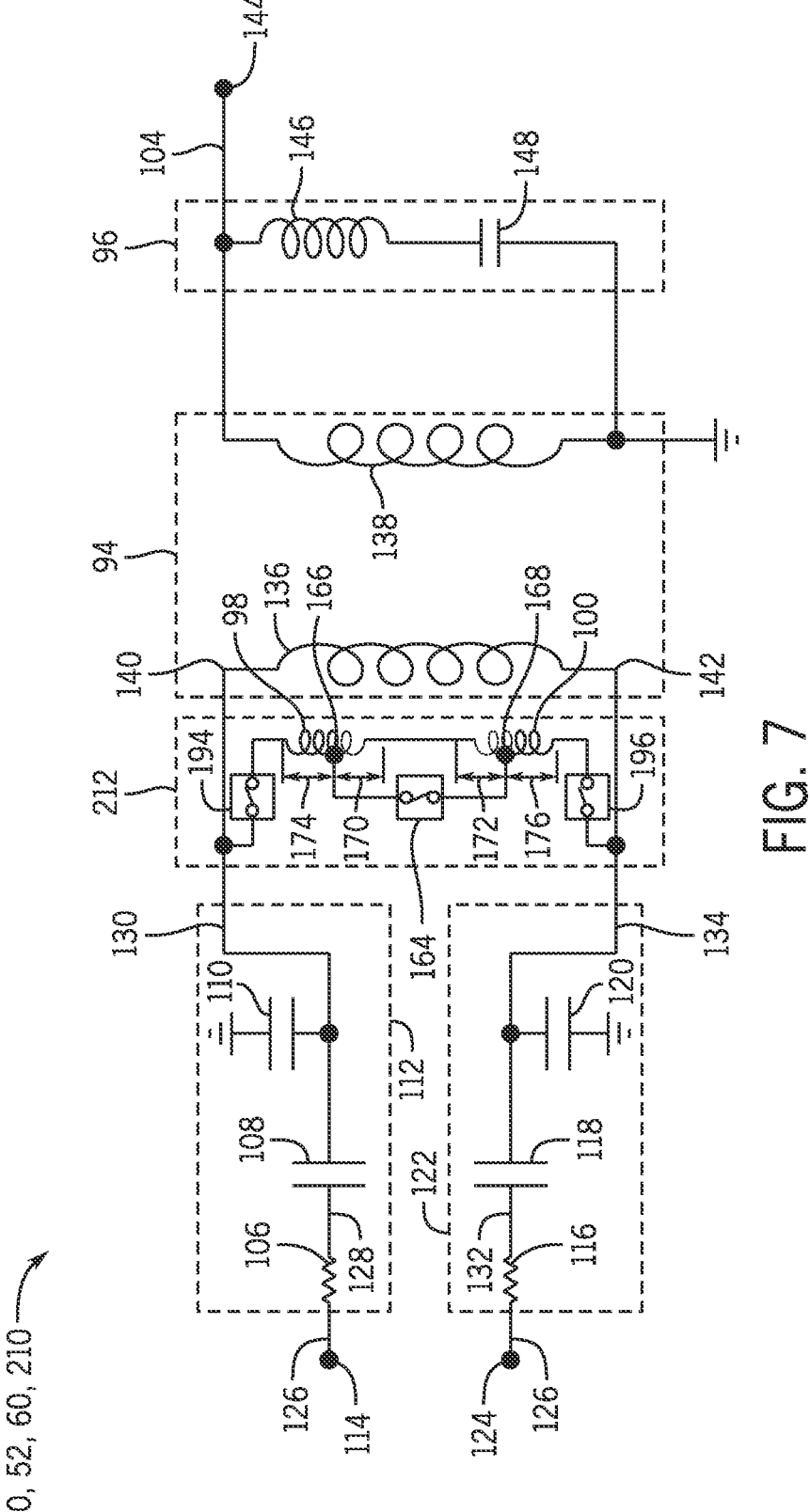
FIG. 7 is a circuit diagram of a fourth power amplifier of the transmitter of FIG. 3 including a fourth programmable inductance matching circuit including the first shunt inductor, the second shunt inductor, a first side switch, and a second side switch, and the second middle switch coupled to intermediate tapping points of the first shunt inductor and the second shunt inductor, and the impedance matching circuit, according to embodiments of the present disclosure.

FIG. 7 is a schematic diagram of a fourth power amplifier 210 including a fourth inductance matching circuit 212 (e.g., a fourth programmable inductance matching circuit), the impedance matching circuit 94, and the filter 96. The fourth inductance matching circuit 212 may improve output power and a bandwidth of the second power amplifier 160 for generating the amplified signals 104 (e.g., output signals), as will be appreciated. In some embodiments, the power amplifier 60 of the electronic device 10 discussed above with respect to FIG. 3 may include the fourth power amplifier 210. In such embodiments, the power amplifier 60 may generate the amplified signals 104 with improved output power and/or bandwidth. For example, the bandwidth of each fourth power amplifier 210 may correspond to a larger portion of the bandwidth of the electronic device 10. Accordingly, the electronic device 10 may include a reduced number of power amplifiers 60 and/or transmitters 52 to generate the amplified signals 104 based on including the fourth power amplifier 210. In such cases, a circuit area of the transmitter 52 and/or the electronic device 10 may be reduced.

As discussed above, the fourth power amplifier 210 may include the first branch 112 including the first resistor 106, the first capacitor 108, and the first shunt capacitor 110. The first resistor 106 may be coupled to the first input terminal 114 to receive the input signals 126. The first capacitor 108 may be coupled to the first resistor at the first node 128. The first shunt capacitor 110 may be coupled to the first capacitor 108 at the second node 130. Moreover, the fourth power amplifier 210 may include the second branch 122 including the second resistor 116, the second capacitor 118, and the second shunt capacitor 120. The second resistor 116 may be coupled to the second input terminal 124 to receive the input signals 126 (e.g., the differential input signals). The second capacitor may be coupled to the second resistor at the third node 132. The second shunt capacitor 120 may be coupled to the second capacitor 118 at the fourth node 134.

As mentioned above, the impedance matching circuit 94 may include the primary coil 136 and the secondary coil 138. The primary coil 136 may have the first terminal 140 and the second terminal 142. Moreover, the filter 96 (e.g., a notch filter, the filter 70, among other possibilities) may include an output inductor 146 and an output capacitor 148 to filter the amplified signals 104. For example, the filter 96 may reduce undesired portions of the amplified signals 104 having a frequency higher than a threshold, below a threshold, outside a high threshold and a low threshold, or inside a high threshold and a low threshold.

The fourth inductance matching circuit 212 may include the first shunt inductor 98, the second shunt inductor 100, the first side switch 194, the second side switch 196, and the second middle switch 164. The first side switch 194 may be coupled to the first shunt inductor 98 on one side and may be coupled to the first capacitor 108, the first shunt capacitor 110, and the first terminal 140 of the primary coil 136 at the second node 130 on a second side. The second side switch 196 may be coupled to the second shunt inductor 100 on one side and may be coupled to the second capacitor 118, the second shunt capacitor 120, and the second terminal 142 of the primary coil 136 at the fourth node 134 on a second side.

The second middle switch 164 may be coupled to the first intermediate tapping point 166 of the first shunt inductor 98 (e.g., by splitting a coil of the first shunt inductor 98 into two equal or unequal parts at the first intermediate tapping point 166, bisecting the first shunt inductor 98 at the first intermediate tapping point 166) and the second intermediate tapping point 168 of the second shunt inductor 100 (e.g., by splitting a coil of the second shunt inductor 100 into two equal or unequal parts at the second intermediate tapping point 168, bisecting the second shunt inductor 100 at the second intermediate tapping point 168). In different embodiments, the second middle switch 164 may be coupled to different intermediate tapping points of the first shunt inductor 98 and/or the second shunt inductor 100. As such, the first fraction 170 (e.g., one eighth, three eights, a quarter, half, five ninth, and so on) of the first shunt inductor 98 and/or the second fraction 172 (e.g., one eighth, three eights, a quarter, half, five ninth, and so on) of the second shunt inductor 100 may be bypassed when the second middle switch 164 is closed along with the first side switch 194 and the second side switch 196 being closed.

In some embodiments, the processor 12 of the electronic device 10 discussed above with respect to FIG. 1, or any other viable processor and/or controller may generate control signals to close and open the first side switch 194, the second side switch 196, and the second middle switch 164. In some cases, the processor 12 may open and close the first side switch 194 with the second side switch 196. For example, the processor 12 may provide the control signals to the first side switch 194 with providing the control signals to the second side switch 196. The first shunt inductor 98 may disconnect or uncouple from the first branch 112 and the second shunt inductor 100 may disconnect or uncouple from the second branch 122 of the first power amplifier 90 when the first side switch 194 and/or the second side switch 196 are open.

The first shunt inductor 98 may couple to the first capacitor 108, the first shunt capacitor 110, and the first terminal 140 of the primary coil 136 at the second node 130 when the first side switch 194 is closed, the second side switch 196 is closed, and the second middle switch 164 is open. Moreover, the third fraction 174 of the first shunt inductor 98 may couple to the first capacitor 108, the first shunt capacitor 110, and the first terminal 140 of the primary coil 136 at the second node 130 when the second middle switch 164, the first side switch 194, and second side switch 196 are closed. As mentioned above, the inductive reactance of the first shunt inductor 98 may reduce (e.g., at least partly resonates out) a capacitive reactance of the first shunt capacitor 110 during operation. As such, coupling the first shunt inductor 98 or the third fraction 174 of the first shunt inductor 98 to the first shunt capacitor 110 may improve the power factor of the fourth power amplifier 210 for generating the amplified signals 104 based on reducing the reactive power consumption of the first shunt capacitor 110.

The first shunt inductor 98 may increase the output power of the fourth power amplifier 210 by the first output power amount and the third fraction 174 of the first shunt inductor 98 may increase the output power of the second power amplifier 160 by the second output power amount. For example, the first shunt inductor 98 may reduce the reactive power consumption of the first shunt capacitor 110 to the first reduced reactive power consumption and the third fraction 174 of the first shunt inductor 98 may reduce the reactive power consumption of the first shunt capacitor 110 to the second reduced reactive power consumption. In specific cases, the second reduced reactive power consumption may be higher than the first reduced reactive power consumption. That is, the fourth inductance matching circuit 212 may increase the output power of the fourth power amplifier 210 by reducing the reactive power consumption of the fourth power amplifier 210 the first increased output power based on the first reduced reactive power consumption.

Moreover, the fourth inductance matching circuit 212 may increase the output power of the fourth power amplifier 210 by reducing the reactive power consumption of the fourth power amplifier 210 to a second increased output power based on the second reduced reactive power consumption. In some cases, closing the first side switch 194 and the second side switch 196 or closing the second middle switch 164 may increase the output power of the fourth power amplifier 210 to different (or similar) output power levels. Moreover, reducing the reactive power consumption of the fourth power amplifier 210 may increase linearity of the second power amplifier 160 for generating the amplified signals 104 across the bandwidth of the fourth power amplifier 210.

The second shunt inductor 100 may couple to the second capacitor 118, the second shunt capacitor 120, and the second terminal 142 of the primary coil 136 at the fourth node 134 when the first side switch 194 is closed, the second side switch 196 is closed, and the second middle switch 164 is open. Moreover, the fourth fraction 176 of the second shunt inductor 100 may couple to the second capacitor 118, the second shunt capacitor 120, and the second terminal 142 of the primary coil 136 at the fourth node 134 when the second middle switch 164, the first side switch 194, and the second side switch 196 are closed. As mentioned above, the inductive reactance of the second shunt inductor 100 may reduce (e.g., at least partly resonates out) a capacitive reactance of the second shunt capacitor 120 during operation. As such, coupling the second shunt inductor 100 or the fourth fraction 176 of the second shunt inductor 100 to the first shunt capacitor 110 may improve the power factor of the fourth power amplifier 210 for generating the amplified signals 104 based on reducing the reactive power consumption of the first shunt capacitor 110.

The second shunt inductor 100 may increase the output power of the fourth power amplifier 210 by the third output power amount and the fourth fraction 176 of the second shunt inductor 100 may increase the output power of the fourth power amplifier 210 by the fourth output power amount. For example, the second shunt inductor 100 may reduce the reactive power consumption of the second shunt capacitor 120 to the third reduced reactive power consumption and the fourth fraction 176 of the second shunt inductor 100 may reduce the reactive power consumption of the second shunt capacitor 120 to the fourth reduced reactive power consumption. In specific cases, the fourth reduced reactive power consumption may be higher than the third reduced reactive power consumption. That is, the fourth inductance matching circuit 212 may increase the output power of the fourth power amplifier 210 by reducing the reactive power consumption of the fourth power amplifier 210 the third increased output power based on the third reduced reactive power consumption.

Moreover, the fourth inductance matching circuit 212 may increase the output power of the fourth power amplifier 210 by reducing the reactive power consumption of the fourth power amplifier 210 to a fourth increased output power based on the fourth reduced reactive power consumption. In some cases, closing the first side switch 194 and the second side switch 196 or closing the second middle switch 164 may increase the output power of the fourth power amplifier 210 to different (or similar) output power levels. Moreover, reducing the reactive power consumption of the fourth power amplifier 210 may increase linearity of the second power amplifier 160 for generating the amplified signals 104 across the bandwidth of the fourth power amplifier 210.

The first shunt inductor 98 and the primary coil 136 may be disposed in parallel when the first side switch 194 is closed, the second side switch 196 is closed, and the first middle switch 102 is open. Similarly, the second shunt inductor 100 and the primary coil 136 may be disposed in parallel when the first side switch 194 is closed, the second side switch 196 is closed, and the first middle switch 102 is open. As such, the first shunt inductor 98 and the second shunt inductor 100 may reduce the inductance value of the primary coil 136 to reduce the equivalent inductance of the primary side of the impedance matching circuit 94 by a first inductance reduction value. In some cases, reducing the inductance of the primary side of the impedance matching circuit 94 by the first inductance reduction value may increase (e.g., shift higher) a center frequency of the impedance matching circuit 94 (and the fourth power amplifier 210) for generating the amplified signals 104 by the first frequency value. As such, the secondary coil 138 may output the amplified signals 104 via the output terminal 144 with the first increased frequency.

Moreover, the third fraction 174 of the first shunt inductor 98 may be disposed in parallel with the primary coil 136 when the second middle switch 164, the first side switch 194, and the second side switch 196 are closed. Similarly, the fourth fraction 176 of the second shunt inductor 100 may be disposed in parallel with the primary coil 136 when the second middle switch 164, the first side switch 194, and the second side switch 196 are closed. As such, the third fraction 174 of the first shunt inductor 98 and the fourth fraction of the second shunt inductor 100 may reduce the inductance value of the primary coil 136 to a lower inductance value to reduce the equivalent inductance of the primary side of the impedance matching circuit 94 by a second inductance reduction value.

As mentioned above, in specific cases, the second inductance reduction value may be smaller than the first inductance reduction value. Moreover, in some cases, reducing the inductance of the primary side of the impedance matching circuit 94 by the second inductance reduction value may increase (e.g., shift higher) the center frequency of the impedance matching circuit 94 for generating the amplified signals 104 by the second frequency value. In some embodiments, the second frequency value may be higher than the first frequency value. As such, the secondary coil 138 may output the amplified signals 104 via the output terminal 144 with a second increased frequency. For example, the second increased frequency may be higher than the first increased frequency.

In some embodiments, the fourth inductance matching circuit 212 may adjust the center frequency to shift a high threshold and/or a low threshold of the bandwidth of the fourth power amplifier 210. For example, the processor 12 may generate control signals to open the second middle switch 164 (when the first side switch 194 and the second side switch 196 are closed) to shift the center frequency up by the first frequency value or may close the second middle switch 164 (when the first side switch 194 and the second side switch 196 are closed) to shift the center frequency up by the second frequency value. In such embodiments, the fourth inductance matching circuit 212 may increase the bandwidth of the second power amplifier 160 by adjusting the center frequency of the impedance matching circuit 94. In some cases, the bandwidth of each fourth power amplifier 210 may correspond to a larger portion of the bandwidth of the electronic device 10. Accordingly, in some cases, the electronic device 10 may include a reduced number of the fourth power amplifiers 210 for generating the amplified signals 104 across the bandwidth of the transmitter 52. In such embodiments, the electronic device 10 may use a reduced circuit area for generating the output signals across the bandwidth of the transmitter 52.

It should be appreciated that in alternative or additional embodiments, the fourth power amplifier 210 may include additional and/or reduced components. For example, it should be appreciated that although the illustrated fourth power amplifier 210 includes differential input terminals 114 and 124, in alternative or additional embodiments, the fourth power amplifier 210 may have a single-ended input receiving the input signals 126. In such embodiments, the single-ended fourth power amplifier 210 may include the first resistor 106, the first capacitor 108, and the first shunt capacitor 110. The single-ended fourth power amplifier 210 may include the first shunt inductor 98 coupled to the first resistor 106, the first capacitor 108, the first shunt capacitor 110, and the first terminal of the primary coil 136 via the first side switch 194. Moreover, the first shunt inductor 98 may also be coupled to the second middle switch 164. For example, the first shunt inductor 98 or the third fraction 174 of the first shunt inductor 98 may couple to the first resistor 106, the first capacitor 108, the first shunt capacitor 110, and the first terminal of the primary coil 136 based on closing and opening the second middle switch 164. The second terminal of the primary coil 136 and the secondary coil 138 may also be coupled to the ground connection.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The invention claimed is:

1. A power amplifier comprising:
   a first branch comprising a first resistor and a first capacitor coupled to the first resistor;
   a second branch comprising a second resistor and a second capacitor coupled to the second resistor;
   an impedance matching circuit comprising
   a primary coil coupled to the first capacitor and the second capacitor, and
   a secondary coil; and
   an inductance matching circuit comprising
   a first shunt inductor coupled to the first capacitor and the primary coil, and
   a second shunt inductor coupled to the second capacitor and the primary coil.

2. The power amplifier of claim 1, wherein the first resistor is coupled to the first capacitor at a first node, and the first capacitor and the primary coil are coupled to the first shunt inductor at a second node via a switch.

3. The power amplifier of claim 1, wherein the inductance matching circuit comprises a switch coupled to a ground connection and an intermediate tapping point of the first shunt inductor, the primary coil is coupled to the ground connection, and the secondary coil is coupled to the ground connection.

4. The power amplifier of claim 1, wherein the inductance matching circuit comprises a switch coupled to the first shunt inductor and a ground connection.

5. The power amplifier of claim 1, wherein the first branch comprises a first shunt inductor coupled to the first capacitor, the primary coil, and the first shunt inductor, and the second branch comprises a second shunt inductor coupled to the second capacitor, the primary coil, and the second shunt inductor.

6. The power amplifier of claim 5, comprising a switch coupled to a first intermediate tapping point of the first shunt inductor and a second intermediate tapping point of the second shunt inductor.

7. The power amplifier of claim 5, wherein
   the first shunt inductor is coupled to the first capacitor, the first shunt capacitor, and the primary coil via a first switch, and
   the second shunt inductor is coupled to the second capacitor, the second shunt capacitor, and the primary coil via a second switch.

8. The power amplifier of claim 5, wherein the inductance matching circuit comprises a switch coupled to the first shunt inductor and the second shunt inductor.

9. A transmitter comprising:
   a first branch and a second branch configured to generate an amplified signal based on receiving outgoing data;
   an impedance matching circuit comprising a primary coil and a secondary coil, the primary coil being coupled to the first branch and the second branch, and the secondary coil being configured to output the amplified signal; and
   an inductance matching circuit comprising a first shunt inductor and a second shunt inductor, the first shunt inductor being coupled to the first branch and the primary coil, the second shunt inductor being coupled to the second branch and the primary coil, the first shunt inductor and the second shunt inductor configured to reduce a capacitive reactance of the first branch and the second branch.

10. The transmitter of claim 9, wherein the first branch comprises a first resistor, a first capacitor coupled to the first resistor, and a first shunt capacitor coupled to the first capacitor, and the second branch comprises a second resistor, a second capacitor coupled to the second resistor, and a second shunt capacitor coupled to the second capacitor.

11. The transmitter of claim 9, wherein the inductance matching circuit comprises a switch coupled to the first shunt inductor and the second shunt inductor.

12. The transmitter of claim 11, wherein the switch is configured to disconnect the first shunt inductor from the first branch and the primary coil and disconnect the second shunt inductor from the second branch and the primary coil, and connect the first shunt inductor to the first branch and the primary coil and connect the second shunt inductor to the second branch and the primary coil.

13. The transmitter of claim 9, wherein the inductance matching circuit comprises a switch coupled to a first intermediate tapping point of the first shunt inductor and a second intermediate tapping point of the second shunt inductor.

14. The transmitter of claim 9, wherein the first shunt inductor is coupled to the first branch and the primary coil via a first switch, and the second shunt inductor is coupled to the second branch and the primary coil via a second switch.

15. The transmitter of claim 14, wherein the first switch and the second switch are configured to disconnect the first shunt inductor from the first branch and the primary coil and disconnect the second shunt inductor from the second branch and the primary coil, and connect the first shunt inductor to the first branch and the primary coil and connect the second shunt inductor to the second branch and the primary coil.

16. An electronic device comprising:

one or more antennas; and a power amplifier coupled to the one or more antennas, the power amplifier comprising a first branch comprising a first shunt capacitor and a second branch comprising a second shunt capacitor, the first branch and the second branch configured to generate an amplified signal based on receiving outgoing data from a processor, an impedance matching circuit comprising a primary coil coupled to the first shunt capacitor and the second shunt capacitor, and a secondary coil configured to output the amplified signal to the one or more antennas, and an inductance matching circuit comprising a first shunt inductor coupled to the first shunt capacitor and the primary coil, the first shunt inductor configured to reduce a capacitive reactance of the first shunt capacitor, and a second shunt inductor coupled to the second shunt capacitor and the primary coil, the second shunt inductor configured to reduce a capacitive reactance of the second shunt capacitor.

17. The electronic device of claim 16, wherein the inductance matching circuit comprises a switch coupled to the first shunt inductor and the second shunt inductor.

18. The electronic device of claim 17, wherein the switch is configured to disconnect the first shunt inductor from the first shunt capacitor and the primary coil and disconnect the second shunt inductor from the second shunt capacitor and the primary coil, and connect the first shunt inductor to the first shunt capacitor and the primary coil and connect the second shunt inductor to the second shunt capacitor and the primary coil.

19. The electronic device of claim 16, wherein the first shunt inductor is coupled to the first shunt capacitor and the primary coil via a first switch, and the second shunt inductor is coupled to the second shunt capacitor and the primary coil via a second switch.

20. The electronic device of claim 19, wherein the first switch and the second switch are configured to disconnect the first shunt inductor from the first shunt capacitor and the primary coil and disconnect the second shunt inductor from the second shunt capacitor and the primary coil, and connect the first shunt inductor to the first shunt capacitor and the primary coil and connect the second shunt inductor to the second shunt capacitor and the primary coil.

* * * * *